United States Patent
Ha et al.

(10) Patent No.: US 6,718,293 B1
(45) Date of Patent: Apr. 6, 2004

(54) ETCHING AND GROWTH SIMULATION METHOD USING A MODIFIED CELL MODEL

(75) Inventors: Jae-Hee Ha, Cheongju (KR); Sang-Heup Moon, Seoul (KR); Byeong-Ok Cho, Seoul (KR); Sung-Wook Hwang, Seoul (KR)

(73) Assignee: Hyundai Electronics Industries Co., Ltd., Ichon-Shi (KR)

(*) Notice: Subject to any disclaimer, the term of this patent is extended or adjusted under 35 U.S.C. 154(b) by 0 days.

(21) Appl. No.: 09/372,595

(22) Filed: Aug. 12, 1999

(30) Foreign Application Priority Data

Jan. 27, 1999 (KR) .......................................... 1999/2575

(51) Int. Cl.[7] .......................... G06G 7/48; G06F 17/50
(52) U.S. Cl. ............................. 703/13; 703/6; 703/2; 703/12; 716/19; 716/20
(58) Field of Search ........................ 703/2, 6, 9, 12, 703/13; 716/20, 19; 345/420

(56) References Cited

U.S. PATENT DOCUMENTS

| | | | |
|---|---|---|---|
| 5,070,469 A | | 12/1991 | Kunikiyo et al. ............ 364/578 |
| 5,293,557 A | * | 3/1994 | Fujinaga et al. ................ 703/6 |
| 5,307,296 A | * | 4/1994 | Uchida et al. ................. 716/20 |
| 5,367,465 A | * | 11/1994 | Tazawa et al. ............... 700/121 |
| 5,377,118 A | * | 12/1994 | Leon et al. .................. 345/420 |
| 5,379,225 A | * | 1/1995 | Tazawa et al. ................. 716/20 |
| 5,386,374 A | * | 1/1995 | Meng ............................ 703/2 |
| 5,416,729 A | * | 5/1995 | Leon et al. ..................... 703/2 |
| 5,471,403 A | * | 11/1995 | Fujimaga ...................... 716/19 |
| 5,586,230 A | * | 12/1996 | Leon et al. .................. 345/420 |
| 5,644,688 A | * | 7/1997 | Leon et al. ..................... 703/2 |
| 5,812,435 A | * | 9/1998 | Fujinaga ...................... 703/13 |
| 5,815,684 A | * | 9/1998 | Ohta et al. .................... 703/13 |

* cited by examiner

*Primary Examiner*—William Thomson
(74) *Attorney, Agent, or Firm*—Fleshner & Kim, LLP

(57) ABSTRACT

A computer simulation method for a semiconductor device manufacturing process, includes: a first step for forming an initial section of the material with only open cells exposed to the growth or etching among the cells; a second step for inputting information including growth or etching points into each open cell; a third step for computing a movement speed for the growth or etching points; a fourth step for moving the growth or etching points for a time determined according to the movement speed; and a fifth step for forming a new etching section by re-arranging the open cells exposed to the growth or etching, after moving the growth or etching points, the second to fifth steps being repeatedly performed on the re-arranged open cells until the sum of the predetermined time reaches the time (T).

28 Claims, 12 Drawing Sheets

ETCHING AND GROWTH SIMULATION METHOD USING A MODIFIED CELL MODEL

BACKGROUND OF THE INVENTION

1. Field of the Invention

The present invention relates to a computer simulation method for a manufacturing process of a semiconductor device, and in particular to a computer simulation method of a surface shape of a semiconductor device using a modified cell model during etching and growth of the device.

2. Description of the Background Art

In a manufacturing process of a semiconductor device, there have been generally used two computer simulation methods for modeling a geometrical surface shape of the semiconductor device and predicting its varied surface shape during etching or growth. One method is a cell model considering the entire material to be etched or deposited, and the other method is a string model considering merely a surface of the material to be etched or deposited.

First, the cell model will now be described. In the cell model, the entire material to be etched or deposited is divided into square-shaped cells of a predetermined size. In the case of etching, the time for each cell to be removed depends upon the number of exposed sides and an etching speed of the cells. FIG. 1 is a cross-sectional view illustrating an etching computer simulation using the cell model. Reference numerals 0, 1 and 2 denote the air in an etching chamber, a semiconductor substrate, respectively. That is, as depicted in FIG. 1, a hole is formed by etching the semiconductor device 1 using the mask 2. As shown therein, etching is carried out along a surface consisting of the cells which are not etched and located closely to the etched cells. As a cell is removed by etching, another cell is exposed. In the cell model, the smaller the size of cell is, the higher the resolution is. As a result of smaller cell size, the accuracy of the computer simulation is improved, but the computation time is increased. Accordingly, it is required to properly adjust the accuracy and computation time.

Therefore, there is a disadvantage in that obtaining a more accurate result takes a longer time and requires a large amount of memory. Also the entire material considering a depth, in addition to the surface to be etched or deposited is divided into cells, and all information regarding the cells is stored, thus requiring the large amount of memory. It is thus inefficient because of a longer computation time.

Second, the string model which is another conventional computer simulation method, will now be explained. FIG. 2 is a cross-sectional view illustrating a step of computer simulation of a material surface during etching using the string model. In the case of the string model, etching points are determined at certain intervals along the surface to be etched, and are moved at certain intervals of time by a distance computed by an etching speed. FIG. 2 illustrates a section before the etching 3 and a section after the etching 4 on which the computer simulation is carried out. As depicted in FIG. 2, there are the etching points (X) at the section before the etching 3 positioned at certain intervals of time. When the computer simulation is performed, the etching points (X) are moved at certain intervals of time, thereby obtaining moved etching points (X'). The moved etching points (X') are connected by straight lines, thereby obtaining the surface after etching 4. As illustrated in FIG. 2, each string at the etching sections has a different etching speed and direction according to its surface angles. It is presumed that a vector taking the etching speed and etching direction as its size and direction, respectively, is a motion vector of each string. The motion vector of the etching point where two strings. Meet each other is defined as a sum of the motion vectors of the two adjacent strings. The string is reconstituted by connecting the moved etching points obtained by the sums of the motion vectors in respect of each etching point. If the string is too long, it is shortened to a proper length by a remeshing operation.

The computation time of the above-described string model is faster than the cell model. The computation times of the computer simulations each respectively employing the cell models of different density and the string model are compared in Table I.

TABLE 1

Comparison in Computation Time of Computer simulations using Cell Models of Different Density and String Model.

| Model | Computation Time | Increase of CPU |
| --- | --- | --- |
| string model (string length = 0.1 $\mu$m) | 13 Seconds | None |
| Cell model (100 × 50 = 5000 cells) | 22 seconds | 1.0 |
| Cell model (200 × 100 = 20000 cells) | 141 seconds | 6.4 |
| Cell model (400 × 200 = 80000 cells) | 1058 seconds | 48.1 |

As discussed earlier, in the case of the cell model, the more the cell density increases, the more demand upon the central processing unit (CPU) is increased. As a result, the computation time is also increased. Also, although the string model is faster in computation than the cell model, it has several disadvantages. In the light of the etching, the string model has the following disadvantages.

First, in determining an interval of the etching point, namely a string length, a surface shape is possibly described merely with a small number of strings when the surface is flat. However, in the case of an uneven surface, a great many of strings are required to exactly describe a geometrical surface shape, which results in an increase of the computation time.

Second, when the etching speed is sharply changed, if the time interval of moving the etching point, namely the interval of etching time if not very small, it is impossible to exactly describe a shape of the etching section according to the rapid change of the etching speed. Accordingly, the shape of the section after completing the computer simulation may be remarkably different from the actual shape of the etching section. In addition, if the interval of etching time updating is shortened for the accuracy of the computer simulation a large amount of memory is necessary, and the computation time is increased.

Third, when the interval of etching time and the string length are not appropriate, or when the etching speed is sharply changed according to the position, the strings may become tangled with one another, thus forming a loop. FIG. 3a depicts a loop formed by connecting the moved etching points, when the interval of etching time is large, and the etching points have severely different movement direction and movement size. The loop does not accurately describe the actual etched section, and thus must be removed by a delooping operation, as illustrated in FIG. 3b. The de-looping operation designates an intersect point of the strings re-constituted by the moved etching points as a new etching point, and then removes the loop. Accordingly, the string model has a disadvantage in that it requires such a loop removal process, thus complicating the computation process.

SUMMARY OF THE INVENTION

It is therefore an object of the present invention to provide an improved computer simulation method employing a modified cell mainly having the properties of a cell model and additionally having those of a string model, which can obtain an accurate computation result and a rapid computation speed, and can prevent a loop from occurring.

In order to achieve the above-described object of the present invention, in a growth or etching computer simulation method dividing a material to be deposited or etched into cells in a predetermined size, and simulating a surface shape of the material after carrying out the growth or etching for a time T, the growth or etching computer simulation method using a modified cell model, includes: forming an initial section of the material with open cells among the cells exposed to the growth or etching; inputting information including growth or etching points into each open cell; computing a movement speed for the growth of etching points; moving the growth or etching points for a time determined according to the movement speed; forming a new etching section by re-arranging the open cells exposed to the growth or etching, after moving the growth or etching points, such steps being repeatedly performed on the re-arranged open cells until the sum of the predetermined time reaches the time (T).

BRIEF DESCRIPTION OF THE DRAWINGS

The present invention will described with reference to the accompanying drawings which are given only by way of illustration and thus are not limitative of the present invention, wherein:

FIGS. 6 to 9 are cross-sectional views illustrating an embodiment of the etching computer simulation using the modified cell model according to the present invention, wherein:

FIG. 6 is a cross-sectional view illustrating a state where an etching point reaches the bottom side of a cell;

FIGS. 7 and 8 are cross-sectional views illustrating a state where the etching points of different shape numbers reach the right side of a cell, respectively; and FIG. 9 is a cross-sectional view illustrating etching points of different shape number from FIG. 6 reaching to the bottom side of a cell;

DETAILED DESCRIPTION OF THE INVENTION

An etching and growth computer simulation using a modified cell model in accordance with the present invention will now be described in detail in the case of the etching.

First, a section to be etched is divided into square-shaped cells of a certain size. An initial etching section is formed merely by cells exposed to the etching (Hereinafter, referred as open cells) among the thusly divided cells. The serial numbers, coordinates, shape numbers, etching points and surface angles are inputted or attributed into each open cell. In regard to the each open cell, a movement speed of the etching point is obtained by an etching speed expression, and a time for the etching point to reach one side of each open cell is computed therefrom. When the time of the smallest value among the times computed is selected, and the etching points of the open cells are all moved for the selected time of the smallest value, the etching point reaches to one side of the cell of the shortest time. According to an extinction rule of the cells, when the etching point reaches one side of a cell, the cell is removed. Then, according to a generation rule of the cells, an open cell newly exposed to the etching medium is added. Thereafter, according to a modification rule of the cell, the open cells are re-arranged, thus forming a new etching section. Similar to the initial etching section, the serial numbers, coordinates, shape numbers, etching points and surface angles are inputted into the new open cells. A process of moving the etching points is performed for a given time, thereby completing the etching computer simulation using the modified cell model according to the present invention. A similar method is employed in the case of simulating a growth.

Each process of the etching computer simulation method using the modified cell model will now be described in detail with reference to FIGS. 4 to 11.

Figure 1:
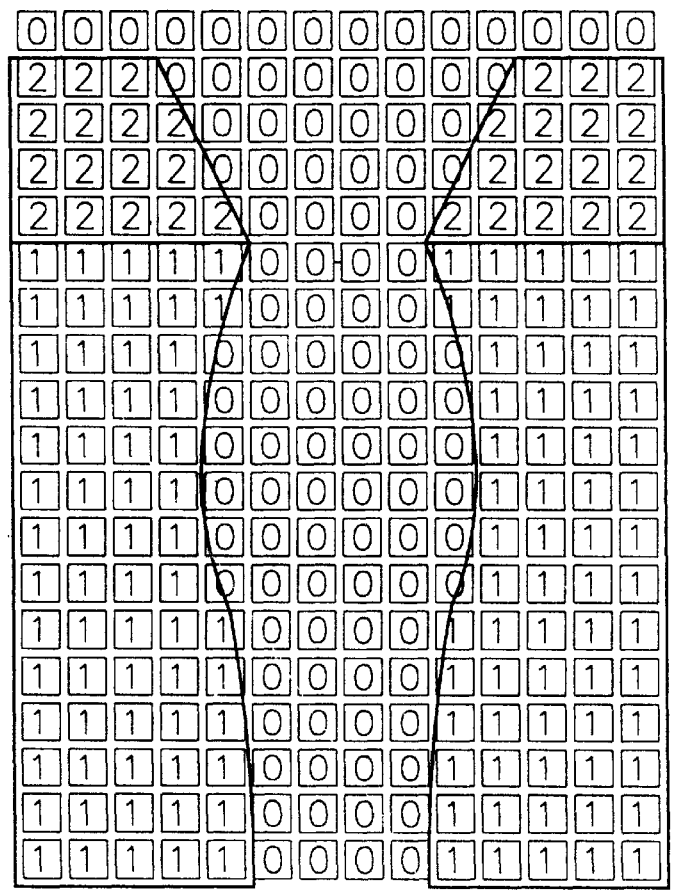
FIG. 1 is a cross-sectional view illustrating an etching computer simulation using a conventional cell model.
Figure 2:
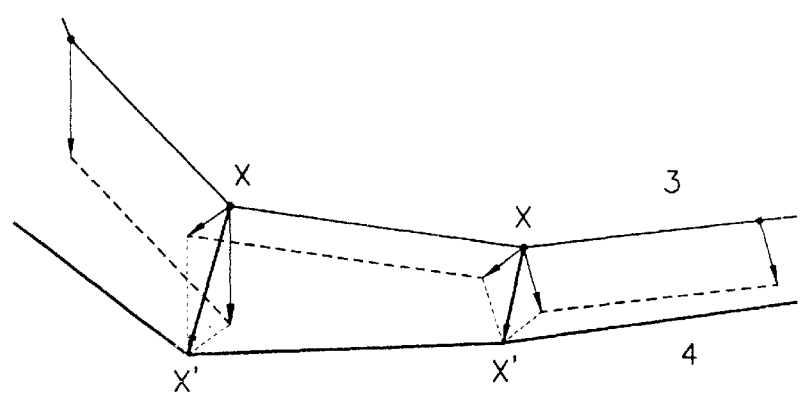
FIG. 2 is a cross-sectional view illustrating an etching computer simulation using a conventional string model.
Figure 3A:
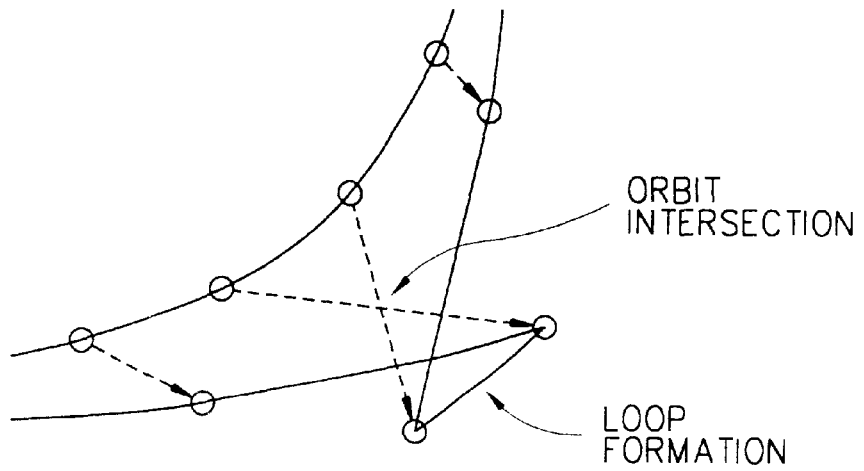
FIGS. 3a to 3b are cross-sectional views respectively illustrating forming and removing of a loop generated in the conventional string model.
Figure 3B:
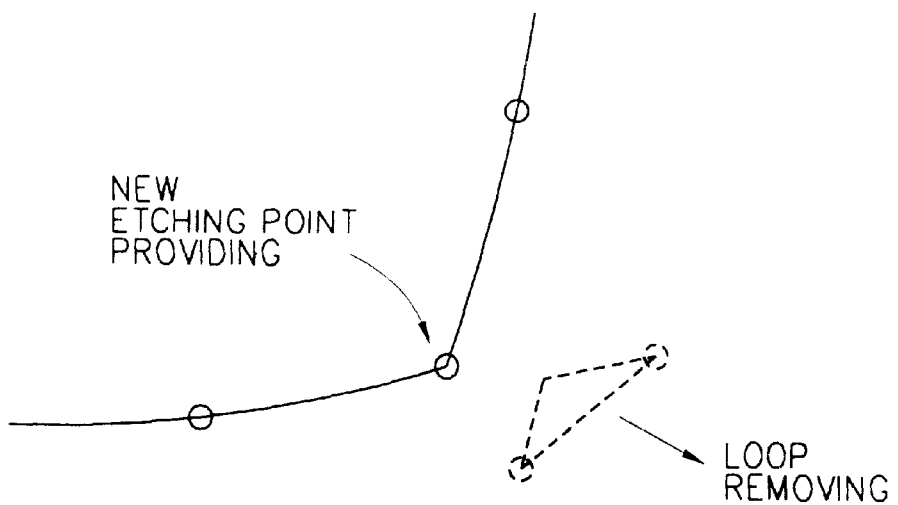
Figure 4:
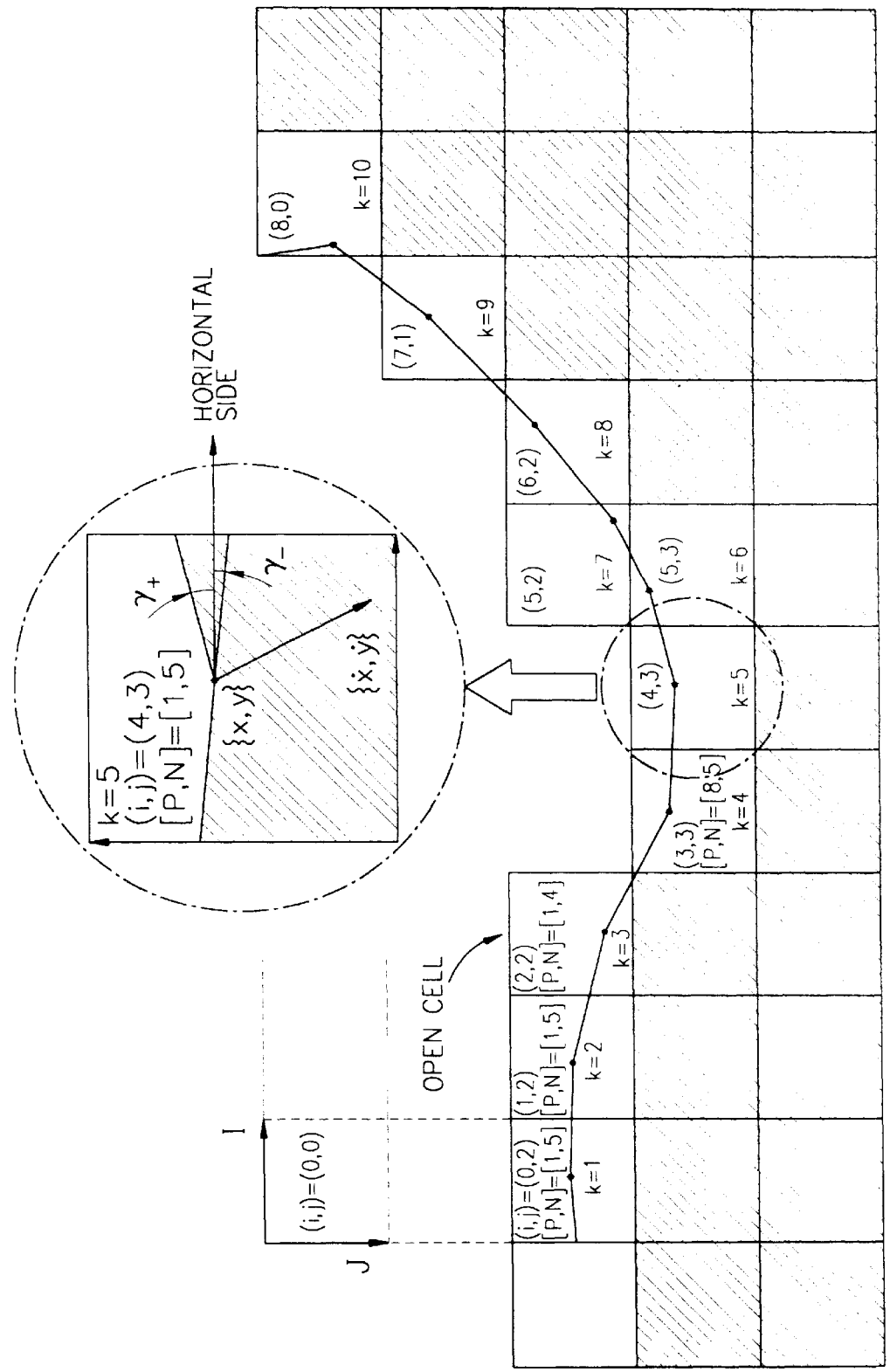
FIG. 4 is a cross-sectional view illustrating an etching computer simulation using a modified cell model according to the present invention.

FIG. 4 illustrates an etching section of the etching computer simulation using the modified cell model according to the present invention. As shown therein, the etching section is divided into square cells of a certain size. A size of the square-shaped cells is determined in accordance with the desired surface resolution and computation time. The serial numbers, co-ordinates, shape numbers, etching points and surface angles are inputted into the open cells exposed to the etching medium. Such dividing of the section to be etched into the square-shaped cells of a certain size, is identical to the conventional art. However, in contrast to the conventional art, the open cells (those cells not diagonally shaded)

among the cells, exposed to the etching are configured in a predetermined order, and the information such as the serial numbers, coordinates, shape numbers, etching points and shape angles are inputted into the open cells. Here, the entire material to be etched is not considered as in the conventional cell model. That is, only the open cells, namely the cells of the surface exposed to the etching medium are considered, a concept of which being adopted from the conventional string model.

On the other hand, the definition of the information such as the serial numbers, coordinates, shape numbers, etching points and shape angles, which are inputted into the open cells, are as follow.

First, the serial number k indicates the linking order of each open cells and consists of natural numbers designating each open cell one by one according to a predetermined direction. In FIG. 4, cells k=1 to k=10 are sequentially configured from the left to the right.

Second, the coordinates indicate the position of each open cell, and consists of fixed numbers determined based on two axes parallel to the side of the cell, and represented by(i, j). In the next open cell, the numbers of the coordinates are increased by '1.'

Third, the shape number [P, N] includes two numbers, and indicates the position relationship between an open cell and the two adjacent open cells which have the serial numbers reduced or increased from that of the open cell by '1', ie: the adjacent open cells.

Figure 5:
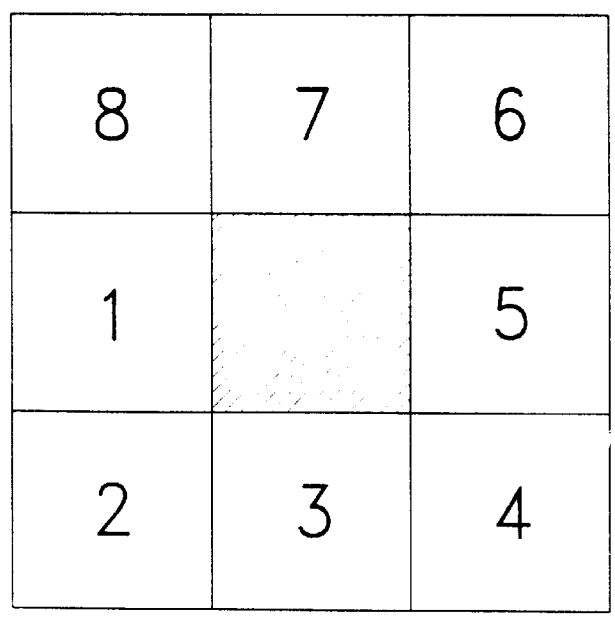
FIG. 5 illustrates position numbers arranged around a single open cell in order to illustrate an embodiment of the shape numbers.

FIG. 5 illustrates eight positions around an open cell (diagonally shaded) in order to explain the shape numbers. The eight positions are numbered as shown in FIG. 5, and the numbers are called as position numbers. That is, the position number to the left side of the corresponding open cell (diagonally shaded) is 1, the position number to its bottom left side is 2, the position number to its bottom side is 3, the position number to its bottom right side is 4, the position number to its right side is 5, the position number to its top right side is 6, and the position number to the top side is 7, and the position number to the top left side is 8. According to the position numbers, the position numbers of the two open cells adjacent to the corresponding open cell are determined. When among the two adjacent open cells, the position number of the cell having a smaller serial number is P, and that of the cell having a greater serial number is N, the shape number of the corresponding open cell is [P, N]. For example, in the case of the cell having the serial number of k=2 in FIG. 4, the k=1 cell of the two adjacent open cells is positioned at the left side of the corresponding cell, namely the k=2 cell.

Accordingly, the position number of the k=1 cell is 1, thus being P=1. Another open cell having the serial number of k=3 adjacent to the corresponding cell is positioned at its right side, and thus the position number of the open cell is 5, thus being N=5. Therefore, the shape number [P, N] of the corresponding cell, namely the k=2 cell is [1, 5]. In addition, in the case of the cell having the serial number of k=3, the k=2 cell of the two adjacent open cells is positioned at the left side of the k=3 cell, namely at the position of p=1, and the k=4 cell is positioned at the bottom right side of the corresponding cell, namely at the position of N=4. Thus, the shape number of the k=3 cell is [1, 4]. Here, the value of N of the k=2 cell, 5 is determined by the position of the k=3 cell, and the value of P of the k=3 cell, 1, is determined by the position of the k=2 cell. The shape numbers of the k=2 and k=3 cells are influenced by each other according to their positions. Here, the relative positions of the cells are symmetrical, and thus the difference in shape number is 4. Generally stating, in the two successive open cells, namely the cells having the serial numbers of k and k+1, a relationship between the N value of the shape number of the kth cell (hereinafter, $N_k$) and the p value of the k+1th cell (hereinafter, $P_{k+1}$) namely ($N_k$ and $P_{k+1}$) always have a relationship selected from the group consisting of (1 and 5), (2 and 6), (3 and 7), (4 and 8), (5 and 1), (6 and 2), (7 and 3) and (8 and 4). The numbers having such a relationship are defined as the complementary numbers. The complementary number of N is represented by $\overline{N}$. Accordingly, in the three successive open cells, namely the k−1th, kth and k+1th cells, the respective shape numbers are related according to Expression 1.

$$[X, \bar{P}]_{k-1} - [P, N]_k - [\bar{N}, Y]_{k+1} \tag{1}$$

Here, the subscripts indicate the serial numbers of the corresponding cells, and—implies that the two cells are adjacent to each other.

The shape number includes the information regarding the number and shape of the open cells to be newly exposed to the etching medium when a cell is removed, and further includes the information regarding the modification of the adjacent cells, as discussed later.

Fourth, the etching point is the point where the etching is actually carried out inside the corresponding open cell. When one side length of the cell is presumed to be 'U', the etching point consists of two real numbers each having a value greater than 0 and less than U, and is represented by {x,y} as illustrated in FIG. 4. The value of the etching point is determined by an axis increasing toward the right direction and another axis increasing in the upward direction, with an apex at the bottom left side of the cell as a starting point. Each etching point indicates an etching degree of the corresponding open cell. In case the etching point reaches any of the four sides of the cell, the cell is extinguished.

Fifth, the surface angle <$Y_-$, $Y_+$> is the angle between the two sections formed based on the etching point and a horizontal side of the cell. As illustrated in FIG. 4, the surface angle is shown in the enlarged view of the k=5 cell where the angle between a right extending surface toward the etching direction based on the etching point and a horizontal side is '$Y_-$', and an angle between the left extending surface and the horizontal side is '$Y_+$'. Here, the surface angle is an acute angle of less 90°.

Information such as the serial number k, the coordinates (i, j), the shape number [P, N], the etching point {x, y} and the surface angle <$Y_-$, $Y_+$> as explained above, is inputted for each of respective open cells, and then the movement speed of the etching point for each of the open cells is computed. The movement speed of the etching point maybe represented by various expressions. For instance, the movement speed may be computed by inputting values of the surface angle and an angle between the open cell and a source causing the etching to a reaction speed expression represented by a reaction constant of the etching reaction and a variable when the etching is actually performed. The pressure in a chamber where the etching takes place may be employed as a variable during the etching. In addition, the variables depend on the kind of etching apparatus. In the case of the etching apparatus using a plasma, the power generating the plasma is employed as a variable.

After the movement speed {x', y'} of the etching point {x, y} in each open cell is computed as described above, there is computed the time for the etching point {x, y} to reach anyside of the four sides of the open cell by the movement speed {x', y'}.

When a shortest value is selected from the values of the time computed as above, and the etching points of the open cells are all moved for the shortest time, a certain etching point having the shortest reaching time reaches one side of the cell. According to the cell extinction rule, when the etching point reaches one side of the cell, the cell is deemed to be extinguished. Thereafter, due to the extinguished cell, the open cell newly exposed to the etching is added according to the cell generation rule. According to the cell modification rule, the open cells are re-arranged at the section after the etching is carried out.

Here, the cell extinction rule implies that, when the etching point is moved in a predetermined cell by its movement speed, if the etching point reaches any of the four sides of the cell, the cell is extinguished. Here, the other cells remain as open cells, but their position relative to the newly-exposed open cell is changed. The shape numbers of the cells are also changed. In addition, the number of the newly generated open cells is varied, and thus the serial numbers of the cells at the section after etching are changed. It is thus necessary to re-arrange the cells. Here, the cell generation rule is connected to the number and property of the newly-generated open cells, and the cell modification rule is connected to the modification of the extinguished cell and its adjacent cells, which will be later discussed. The cell generation and modification rules depend upon the shape number of the extinguished cell and the position of the side that the etching point reaches, which will now be explained with reference to FIGS. 6 to 9.

FIGS. 6 to 9 illustrate various cross-sections of one step during the etching. The section represented by a dashed line is an initial section before one step of the etching, and the section represented by a solid line is a section after one step of the etching. The serial numbers of the open cells at the initial section are represented by . . . k−1, k, k+1, . . . The serial numbers of the newly-added open cells at the section after the etching and the serial numbers changed after the etching are represented by . . . k'−1, k', k+1, . . . Here, k' is a dummy constant. Therefore, when the open cells are completely re-arranged after the etching, the serial numbers are represented again by . . . k−1, k, k+1, . . . .

Figure 6:
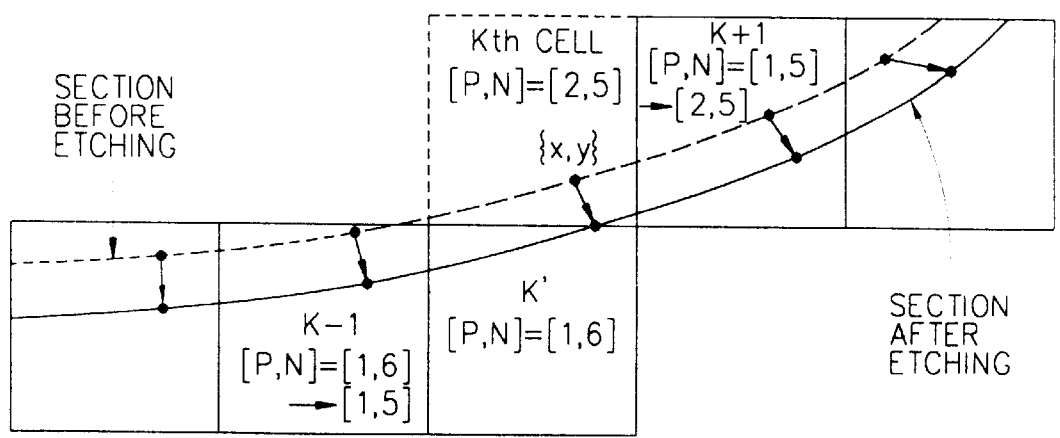
Figure 7:
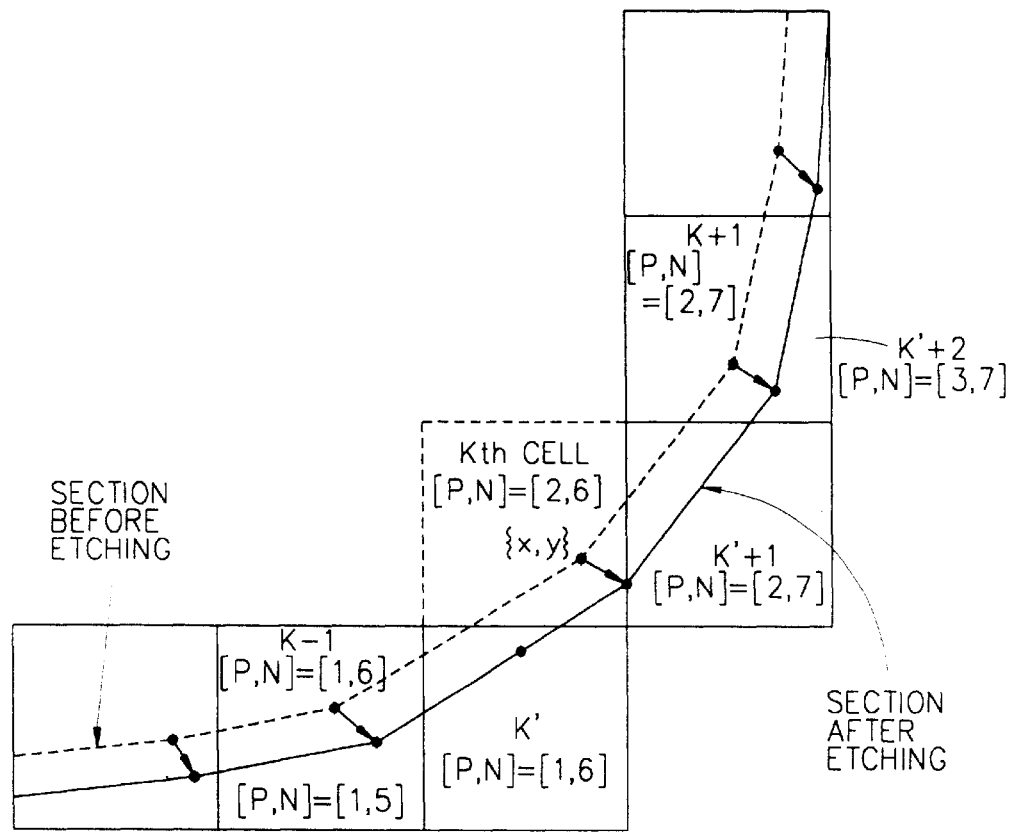
Figure 8:
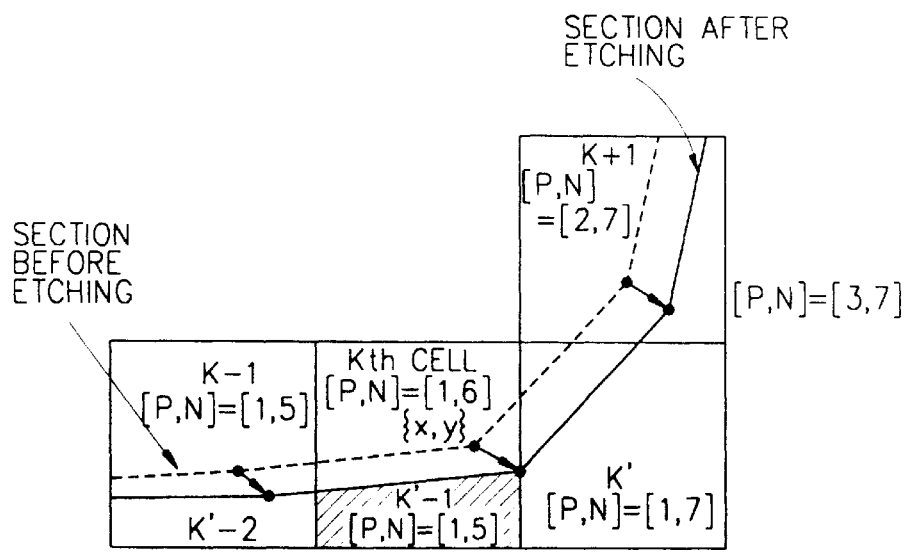
Figure 9:
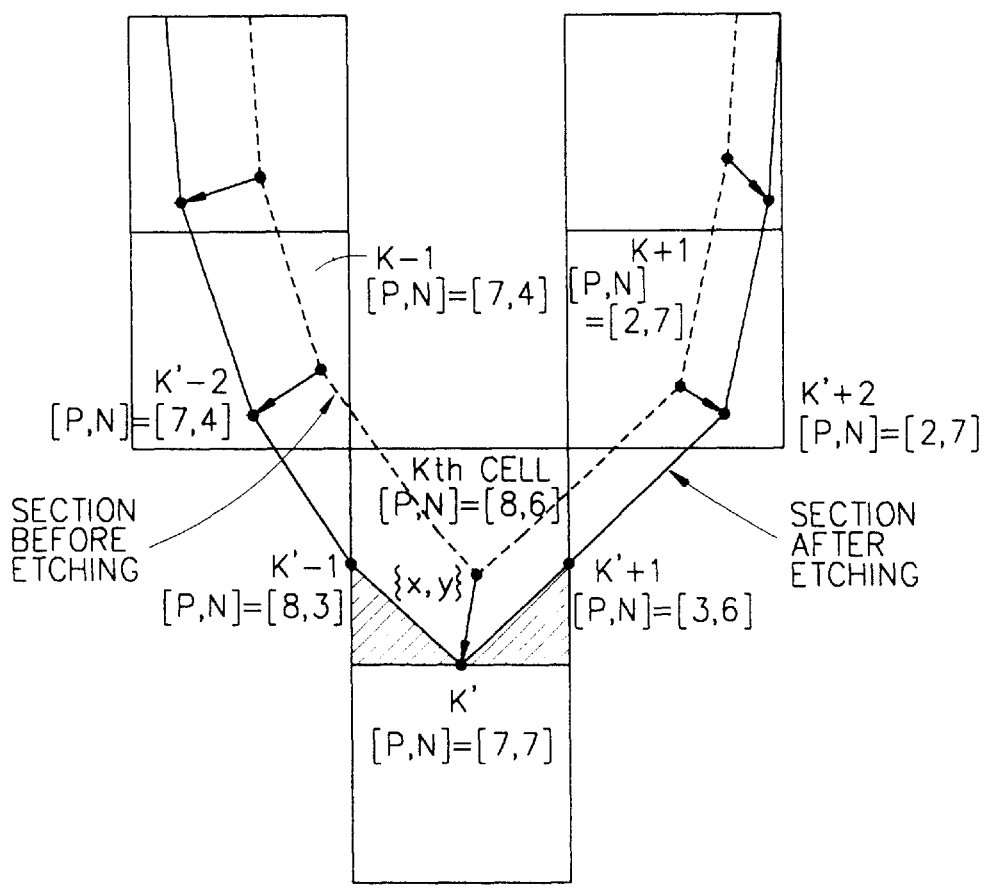

In addition, FIGS. 6 and 9 illustrate a state where the etching point reaches the bottom side of the cell. FIGS. 7 and 8 illustrate a state where the etching point reaches the right side of the cell, the shape numbers of the extinguished cells in FIGS. 6 to 9 are different from one another.

As depicted in FIG. 6, at the initial section, the shape number of the cell having the serial number k is [2, 5]. When the etching point {x, y} in the kth cell is moved, if the etching point reaches the bottom side of the cell, the kth cell is extinguished. At the same time, the k'th cell having the shape code of [1, 6] is newly exposed to the etching medium, and provided with the etching point of the etching point of the extinguished kth cell. Here, the shape number of the k−1th cell that is adjacent to the kth cell is varied from [1, 6] to [1, 5], and the shape number of the k+1 cell is varied from [1, 5] to [2, 5]. In this case, one open cell is extinguished, and a new open cell is generated, thus maintaining the total cell number.

However, as shown in FIG. 7, when the etching point {x, y} is moved in the kth cell, if the etching point reaches its right side, the kth cell having the shape number of [2, 6] is extinguished, and simultaneously the k'th cell having the shape number of [1, 6] and the k'+1th cell having the shape number of [2, 7] are generated as new open cells. As a result, the number of the cells is increased by '1'. The k'+1th cell is provided with the etching point of the kth cell, and the k'th cell is provided with a newly-designated etching point. Here, the shape number of the k−1th cell adjacent to the kth cell is varied from [1, 6] to [1, 5]. The shape number of the k+1 cell is varied from [2, 7] to [3, 7], and the serial number thereof is increased to k'+2 by '1'. As illustrated in FIGS. 6 and 7, when a cell is extinguished, the modification of the adjacent cells, and the number and property of the newly-generated open cells depend upon the shape number of the extinguished cell and the position of the side that the etching point reaches.

On the other hand, as depicted in FIG. 8, when the etching point {x, y} is moved in the kth cell having the shape number of [1, 6], if the etching point reaches its right side, the kth cell is extinguished. At the same time, the k'th cell becomes an open cell as it is newly exposed to the etching, and provided with the etching point of the kth cell. However, as different from FIGS. 6 and 7, although the kth cell is extinguished according to the cell extinction rule, its portion that is not yet etched includes the entire side (here, the bottom side), and thus the two cells where the etching points of the kth and k−1th cells are included after moving, are not connected to each other. In order to connect the two cells, the extinguished kth cell must be included again in the open cells, and is deemed to be a newly-added open cell (k'−1), and provided with a new etching point. As a result, the kth cell having the shape number of [1, 6] is extinguished, and simultaneously the k'th cell having the shape number of [1, 7] and the k'−1th cell having the shape number of [1, 5] are generated as the open cells in FIG. 8. Here, the shape number of the k−1th cell adjacent to the kth cell remains as it is, but the serial number thereof is varied to k'−2. The serial number of the k+1 cell remains as it is, but the shape number thereof is varied from [2, 7] to [3, 7].

In addition, as illustrated in FIG. 9, when the etching point {x, y} is moved in the kth cell having the shape number of [8, 6], if the etching point reaches its bottom side, the kth cell is extinguished. At the same time, the k'th cell is newly added as the open cell, and provided with the etching point of the extinguished kth cell. However, the k−1th and k+1th cells where the etching points are still included after moving are not connected to the k' cell. Accordingly, as in FIG. 8, the kth cell must be included in the open cells, however, differently from FIG. 8, in order for the cells to be connected to one another, the kth cell must be added twice. Also, the etching points must be respectively made in the kth cell added twice. Accordingly, the kth cell having the shape number of [8, 6] is extinguished, and at the same time the k'th cell having the shape number of [7, 7] is generated as an open cell in FIG. 9. In addition, the extinguished kth cell is added twice to be connected with the k'th cell, therefore, the k'−1th and k'+1th cells respectively having the shape numbers of [8, 3] and [3, 6] are generated as the open cells. Accordingly, the number of the newly-generated open cells is '3', which is the maximum number of the cells generated when the cell is extinguished. Here, the shape numbers of the k−1th cell and k+1 cell adjacent to the kth cell remain the same, but the serial numbers thereof are respectively varied to k'−2 and k'+2.

As described above, it is confirmed with reference to FIGS. 6 to 9 that the cell generation rule and the cell modification rule are dependent upon the shape number of the extinguished cell and the position of the side of the cell that the etching point reaches. The general cell generation and modification rules that can be applied to all cases including the cases in FIGS. 6 to 9 will now be explained in detail.

First, the cell generation rule will now be described. The four sides of a cell are numbered like the position number.

The number is referred to as D. That is, the D value of the bottom side of the cell is 3, that of its top side is 7, that of its right side is 5, and that of its left side is 1. Here, in the cells provided by Expression 1, when the etching point in the kth cell reach the side corresponding to D, and thus the cell is extinguished, the arrangement of the newly-generated cell is represented by Expression 2.

$$[X,\tilde{P}]_{k-2}-[P,D]_{k-1}-[\tilde{D},\tilde{D}]_k 31 \ [D,N]_{(k+1)}-[\tilde{N},Y]_{k+2} \quad (2)$$

Expression 2 is connected to the cell generation rule. when Expression 1 is compared with Expression 2, the k−1th and k+1th cells in Expression 1 are replaced by the k−2 and k+2 cells in Expression 2. As mentioned above, when the cell is extinguished, the maximum number of the cells to be generated is '3'. In Expression 2, the three cells are the k−1th, kth and k+1th cells. The value of D implies the position of the side of the cell that the etching point reaches, thus having influence upon the modification of the cell. The values of P and D composing the shape number of the extinguished cell also have influence on the modification of the cell. Accordingly, after the maximum number of cells is generated, the arranged cells are removed or modified according to the values of P, D and N.

Figure 10:
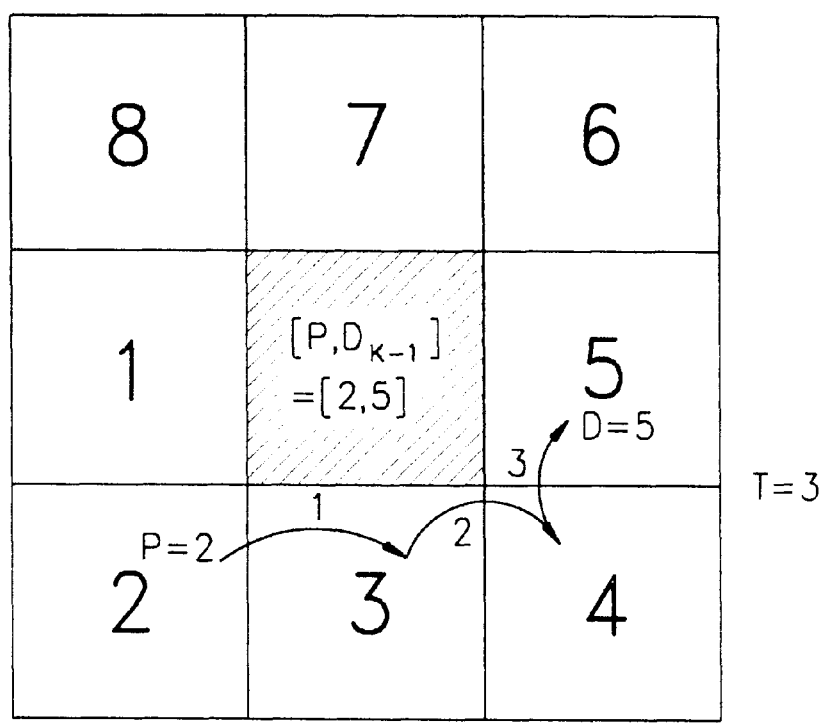
FIG. 10 illustrate position numbers arranged around a single open cell in order to explain how to compute a value of T.
Figure 11A:
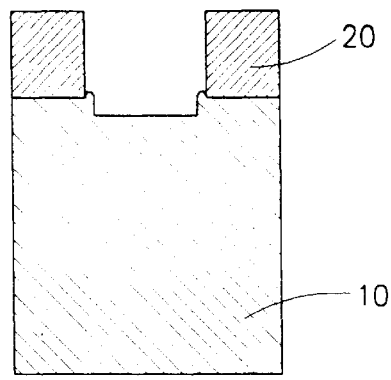
FIGS. 11a to 11f are cross-sectional views illustrating a vertical profile when the etching computer simulation is carried out by using the modified cell model according to the present invention.
Figure 11B:
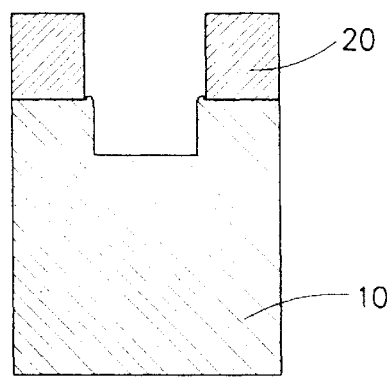
Figure 11C:
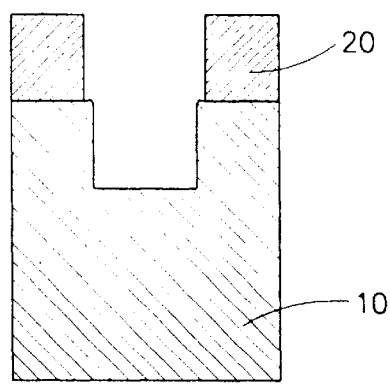
Figure 11D:
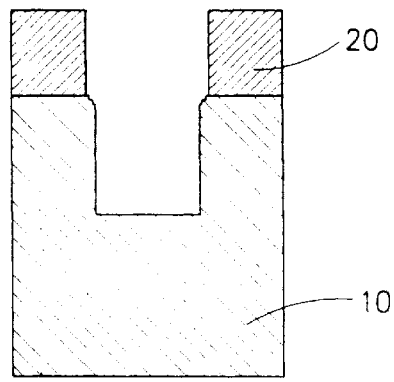
Figure 11E:
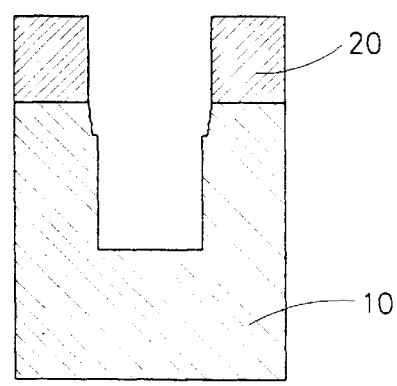
Figure 11F:
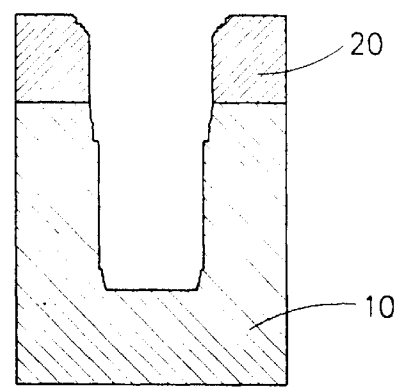

First of all, the modification of the k−1th cell will now be described. The values of P and D that are the shape number of the k−1th cell are positioned in the position number as illustrated in FIG. 10. In case D is located at the Tth position from the P in the counterclockwise direction, the value of T is a positive number between 0 and 7. For example, when the shape number of the k−1th cell generated according to the cell generation rule is $[2, 5]_{k-1}$, the value of T is obtained as follows. As shown in FIG. 10, the value of D, '5' is located at the third position from the value of P, '2' in the counterclockwise direction, and thus the value of T is '3'. According to the value of T, the modification rule for the k−1th cell in Expression 2 is determined as follows.

When 'T=0' is satisfied, the k−1th cell is removed, the value of $\overline{D}$ at the left side of the shape number $[\overline{D},\overline{D}]_k$ of the kth cell, indicating the position relation with the k−1th cell, is replaced by P, and thus the shape number of the kth cell is $[P, \overline{D}]_k$. In addition, as the k−1th cell is removed, this results in increasing the serial numbers of the cells after the k−2th cell by '1', and re-arranging to the cells after the k−1th cell. That is, Expression 2 is modified into Expression 3, as follows.

$$[X,\tilde{P}]_{k-1}-[P,\tilde{D}]_k-[D,N]_{k+1}-[\tilde{N},Y]_{k+2} \quad (3)$$

When 'T=1' is satisfied, the k−1th cell is removed, and the value of $\overline{D}$ at the left side of the shape number $[\overline{D}, \overline{D}]_k$ of the kth cell, indicating the position relation with the k−1th cell, is replaced by $\overline{D} \oplus 2$, and thus the shape number of the kth cell is $[\overline{D} \oplus 2, \overline{D}]_k$. The value of $\overline{P}$ of the shape number [X, $\overline{P}]_{k-2}$ of the k−2th cell is replaced by $\overline{P} \oplus 1$. In addition, as the k−1th cell is removed, this results in increasing the serial numbers of the cells after the k−2th cell by '1', and re-arranging to the cells after the k−1th cell. Here, $\overline{D} \oplus 2$ implies the second position from $\overline{D}$ in the counterclockwise direction when $\overline{D}$ is positioned at the position number as shown in FIG. 10. $\overline{P}\theta1$ indicates the first position from $\overline{P}$ in the clockwise direction. Therefore, Expression 2 is modified into Expression 4 as follows.

$$[X,\tilde{P}\theta1]_{k-1}-[\tilde{D}\oplus2,\tilde{D}]_k-[D,N]_{k+1}-[\tilde{N},Y]_{k+2} \quad (4)$$

When 'T=2' is satisfied, the k−1th cell is removed, and value of $\overline{D}$ at the left side of the shape number $[\overline{D}, \overline{D}]_k$ of the kth cell, indicating the position relation with the k−1th cell, is replaced by $\overline{D} \oplus 1$, and thus the shape number of the kth cell is $[\overline{D}\oplus1, \overline{D}]_k$. The value of $\overline{P}$ of the shape number [X, $\overline{P}]_{k-2}$ of the k−2th cell is replaced by $\overline{P}\theta1$. In addition, as the k−1th cell is removed, this results in increasing the serial numbers of the cells after the k−2th cell by '1', and re-arranging to the cells after the k−1th cell. That is to say, Expression 2 is modified into Expression 5 as follows.

$$[X,\tilde{P}\theta1]_{k-1}-[\tilde{D}\oplus1,\tilde{D}]_k-[D,N]_{k+1}-[\tilde{N},Y]_{k+2} \quad (5)$$

When 'T=3' is satisfied, no cell is removed, and the modification of the cells is determined according to the position of the side that the etching point reaches, which will be discussed later together with the computation of the etching point. Consequently, when the computed etching point of the k−1th cell does not exceed the range of the cell boundaries, Expression 2 is maintained without modification. In case the etching point exceeds the range of the cell boundary, then Expression 2 is modified into Expression 6 as follows.

$$[X,\tilde{P}\theta1]_{k-2}-[\tilde{P}\theta1,\tilde{D}\oplus1]_{k-1}-[\tilde{D}\oplus1,\tilde{D}]_k-[D,N]_{K+1}-[\tilde{N},Y]_{k-2} \quad (6)$$

When T has a value of 4, 5, 6, or 7, the k−1th cell is nor removed and the cells are not modified, and thus Expression 2 remains unchanged.

As stated above, the various modifications of the k−1th cell were explained as a result, Expression 2 is maintained or modified into one of Expressions 3 to 6 according to the value of T of the k−1th cell. Expressions 3 to 6 do not have the modification from the parts after the value of $\overline{D}$ at the right side of the shape number of the kth cell in Expression 2, which occurred in the modification of the k+1th cell.

The modification of the k+1th cell will now be described. Identically to the modification of the k−1th cell, the values of D and N of the shape number $[D, N]_{k+1}$ of the k+1th cell are positioned at the position number as illustrated in FIG. 10. When it is presumed that N is located at the Tth position from D in the counterclockwise direction, the value of T is a positive number between 0 and 7. The modification rule for the k+1th cell is determined according to the value of T.

When 'T=0' is satisfied, the k+1th cell is removed, and $\overline{D}$ at the right side of the shape number of the kth cell, displaying the position relation with the k+1th cell, is replaced by N. In addition, as the k+1th cell is removed, this results in decreasing the serial numbers of the cells after the k+2th cell by '1', and re-arranging to the cells after the k+1th cell. That is, one of Expressions 2 to 6 after the modification of the k−1th cell is modified into Expression 7. In regard to terms before $\overline{D}$ at the left side of the shape number of the kth cell, Expressions 2 to 6 have different values. Expression 7 is thus expressed by using Expression 2.

$$[X,\tilde{P}]_{k-2}-[P,D]_{k-1}-[\tilde{D},N]_k-[\tilde{N},Y]_{k+1} \quad (7)$$

That is, in Expression 7, [X, $\overline{P}]_{k-2}$−[P, D]$_{k-1}$−[$\overline{D}$, that are terms before $\overline{D}$ at the left side of the shape number of the kth cell are dependent upon Expressions 2 to 6 that are the modification results of the k−1th cell, which is identically applied to Expressions 8 to 10 that will be discussed later.

When 'T=1' is satisfied, the k+1th cell is removed, $\overline{D}$ at the right side of the shape number of the kth cell displaying the position relation with the k+1th cell is replaced by $\overline{D}$2, and the value of $\overline{N}$ of the k+2th cell is replaced by $\overline{N} \oplus 1$. In addition, as the k+1th cell is removed, this results in decreasing the serial numbers of the cells after the k+2th cell by '1', and re-arranging to the cells after the k+1th cell. That is, one of Expressions 2 to 6 after the modification of the k−1th cell is modified into Expression 8.

$$[X,\tilde{P}]_{k-2}-[P,D]_{k-1}-[\bar{D},\bar{D}\ominus 2]_k-[\tilde{N}\oplus 1,Y]_{k+1} \quad (8)$$

When 'T=2' is satisfied, the k+1th cell is removed, $\bar{D}$ at the right side of the shape number of the kth cell displaying the position relation with the k+1th cell is replaced by $\bar{D}\ominus 1$, and the value of $\tilde{N}$ of the k+2th cell is replaced by $\tilde{N}\oplus 1$. In addition, as the k+1th cell is removed, this results in decreasing the serial numbers of the cells after the k+2th cell by '1', and re-arranging to the cells after the k+1th cell. That is, One of Expressions 2 to 6 after the modification of the k−1th cell is modified to Expression 9.

$$[X,\tilde{P}]_{k-2}-[P,D]_{k-1}-[\bar{D},\bar{D}\ominus 1]_k-[\tilde{N}\oplus 1,Y]_{k+1} \quad (9)$$

When 'T=3' is satisfied, no cell is removed, and the modifications of the cells are determined according to the position of the side that the etching point reaches, which will be discussed later. As a result, when the computed etching point of the k+1th cell does not exceed the range of the cell, one of Expressions 2 to 6 that are the modification results of the k−1th cell remains unchanged. In case the etching point exceeds the range of the cell, one of Expressions 2 to 6 is modified into Expression 10 as follows.

$$X,\tilde{P}]_{k-2}-[P,D]_{k-1}-[\bar{D},\bar{D}\ominus 1]_k-[\bar{D}\ominus 1,\tilde{N}\oplus 1]_{k+1}-[\tilde{N}\oplus 1,Y]_{k+2} \quad (10)$$

When T has a value of 4, 5, 6 or 7, the removing or modification of the k+1th cell does not take place. Thus, one of Expressions 2 to 6 that are the modification results of the k−1th cell is maintained as it is.

As stated above, the various modifications of the k+1th cell from one of Expressions 2 to 6 that are the modification results of the k−1th cell were explained.

Repeating, Expression 2 is maintained as it is or modified into one of Expressions 3 to 6 according to the value of T of the k−1th cell. Then, one of Expressions 2 to 6 that are the modification results of the k−1th cell is maintained as it is or is modified into one of Expressions 7 to 10 according to the value of T of the k+1th cell, thereby completing the cell modification. Here, the order of the modifications of the k−1th cell and the k+1th cell may be changed. That is, it is possible to modify the k−1th cell is completed in Expression 2.

Till now, the serial number and shape number of each cell are re-arranged. A method of inputting new coordinates and etching point into a new open cell will now be explained. The open cell that is newly generated after the modification is dependent upon the T value of the k−1th cell and the T value of k+1th cell, as described above. Therefore, the method will now be described by using $[P, D]_{k-1}$, $[\bar{D}, \bar{D}]_k$ and $[D, N]_{k+1}$ that are three new open cells of Expression 2 regarding the cell generation rule.

The $[\bar{D}, \bar{D}]_k$ cell will now explained. When it is presumed that the coordinates and etching points of the extinguished cell are respectively (i, j) and {x, y} and that the length of oneside of the cell is U, the coordinates and etching points of the $[\bar{D}, \bar{D}]_k$ cell are determined according to the value of $\bar{D}$, and shown in Table 2.

TABLE 2

Coordinates and Etching Points of $[\bar{D}, \bar{D}]_k$ Cell.

| $\bar{D}$ | Coordinates | Etching points of $[\bar{D}, \bar{D}]_k$ Cell. |
|---|---|---|
| $\bar{D}$= 1 | (i + 1, j) | {0, y} |
| $\bar{D}$= 3 | (i, j − 1) | {x, 0} |
| $\bar{D}$= 5 | (i − 1, j) | {U, y} |
| $\bar{D}$= 7 | (i, j + 1) | {x, U} |

The $[P, D]_{k-1}$ and $[D, N]_{k-1}$ cell among the three newly-generated open cells will now be explained. As described above, according to the modification rule of the k−1th cell and k+1th cell, when the value of T is less than 2, the cells re extinguished, and thus it is not required to compute their coordinates and etching points. Accordingly, only a case where the value of T is greater than 3 is required to be considered. In general, the coordinates and etching points of the newly-generated $[P, D]_{k-1}$ and $[D, N]_{k+1}$ cells are determined by the value of D, and shown in Table 3.

TABLE 3

General coordinates and Etching Points of $[P, D]_{k-1}$ and $[D, N]_{k+1}$ cells.

| D | Coordinates | Etching points of $[P, D]_{k-1}$ cell | Etching points of $[D, N]_{k+1}$ cell |
|---|---|---|---|
| D = 1 | (i, j) | x = 0.5U | x = 0.5U |
| | | $y = y_k + \frac{y_k - y_{k-2}}{x_k - x_{k-2}}(x - x_k)$ | $y = y_k + \frac{y_k - y_{k+2}}{x_k - x_{k+2}}(x - x_k)$ |
| D = 3 | (i, j) | $x = x_k + \frac{x_k - x_{k-2}}{y_k - y_{k-2}}(y - y_k)$ | $x = y_k + \frac{x_k - x_{k+2}}{y_k - y_{k+2}}(y - y_k)$ |
| D = 5 | (i, j) | x = 0.5U | x = 0.5U |
| | | $y = y_k + \frac{y_k - y_{k-2}}{x_k - x_{k-2}}(x - x_k)$ | $y = y_k + \frac{y_k - y_{k+2}}{x_k - x_{k+2}}(x - x_k)$ |
| | | y = 0.5U | y = 0.5U |
| D = 7 | (i, j) | $x = x_k + \frac{x_k - x_{k-2}}{y_k - y_{k-2}}(y - y_k)$ | $x = y_k + \frac{x_k - x_{k+2}}{y_k - y_{k+2}}(y - y_k)$ |
| | | y = 0.5U | y = 0.5U |

Here, when the T values of the $[P, D]_{k-1}$ and $[D, N]_{k+1}$ cells are "3", the etching points computed in Table 3 may exceed the range (U) of the cell. In this case, the coordinates and etching points of the cells are corrected according to tables 4 and 5. Table 4 and 5 show the etching points and coordinates of the $[P, D]_{k-1}$ and $[D, N]_{k+1}$ cells, respectively.

TABLE 4

Coordinates and etching point of $[P, D]_{k-1}$ cells when T has a value of 3 and the etching point computed in Table 3 exceeds the range of the cell.

| D | Coordinates | Etching points of $[P, D]_{k-1}$ cell |
|---|---|---|
| D = 1 | (i, j − 1) | x = 0.5U |
| | | $y = y_k + \frac{y_k - y_{k-2}}{x_k - x_{k-2}}(x - x_k) - U$ |

TABLE 4-continued

Coordinates and etching point of $[P, D]_{k-1}$ cells when
T has a value of 3 and the etching point computed in Table 3
exceeds the range of the cell.

| D | Coordinates | Etching points of $[P, D]_{k-1}$ cell |
|---|---|---|
| D = 3 | (i − 1, j) | $x = x_k + \frac{x_k - x_{k-2}}{y_k - y_{k-2}}(y - y_k) + U$ |
| | | $y = 0.5U$ |
| D = 5 | (i, j + 1) | $x = 0.5U$ |
| | | $y = y_k + \frac{y_k - y_{k-2}}{x_k - x_{k-2}}(x - x_k) + U$ |
| D = 7 | (i + 1, j) | $x = x_k + \frac{x_k - x_{k-2}}{y_k - y_{k-2}}(y - y_k) - U$ |
| | | $y = 0.5U$ |

TABLE 5

Coordinates and etching point of $[D, N]_{k-1}$ cell when
T has a value of 3 and the etching point computed in Table 3
exceeds the range of the cell.

| D | Coordinates | Etching points of $[P, D]_{k-1}$ cell |
|---|---|---|
| D = 1 | (i, j + 1) | $x = 0.5U$ |
| | | $y = y_k + \frac{y_k - y_{k-2}}{x_k - x_{k-2}}(x - x_k) + U$ |
| D = 3 | (i + 1, j) | $x = x_k + \frac{x_k - x_{k-2}}{y_k - y_{k-2}}(y - y_k) - U$ |
| | | $y = 0.5U$ |
| D = 5 | (i, j − i) | $x = 0.5U$ |
| | | $y = y_k + \frac{y_k - y_{k-2}}{x_k - x_{k-2}}(x - x_k) - U$ |
| D = 7 | (i − 1, j) | $x = x_k + \frac{x_k - x_{k-2}}{y_k - y_{k-2}}(y - y_k) + U$ |
| | | $y = 0.5U$ |

As described above, the newly-generated open cell is provided with new coordinates and an etching point. Then, a surface angle of the cell is computed from the etching point, and inputted into the open cell. All information is now inputted into the new open cell, and thus a new etching section is formed. Identically to the initial etching section, the process of moving the etching points for a predetermined time is repeatedly carried out on the new etching section, thereby completing the etching computer simulation using the modified cell model.

FIGS. 11a to 11f illustrate the etching computer simulation using the modified cell model according to the resent invention. As shown therein, a semiconductor substrate 10 is etched by using a mask 20 formed at its upper portion. Here, FIGS. 11a to 11f respectively illustrate the etching sections after 2, 4, 6, 8, 10 and 12 seconds.

Figure 12:
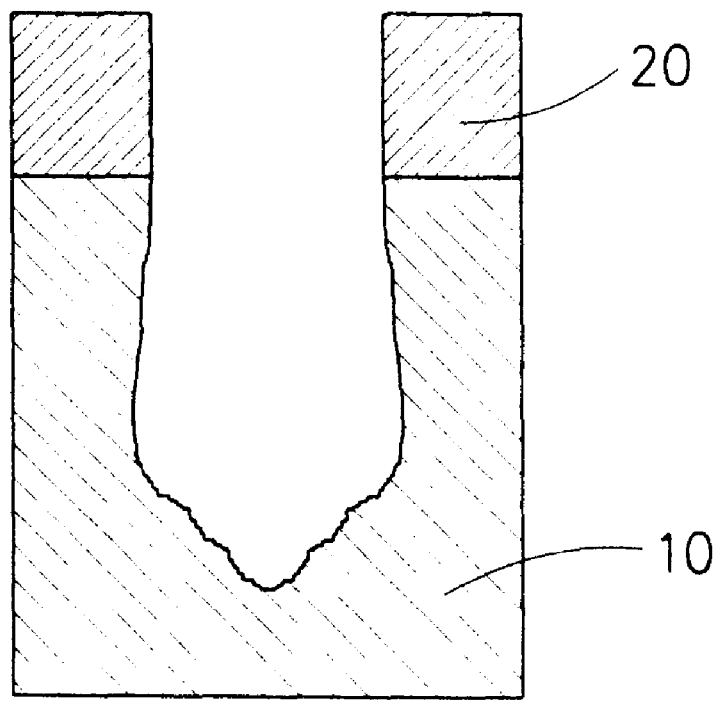
FIG. 12 is a cross-sectional view illustrating a bowing profile when the etching computer simulation is carried out by using the modified cell model according to the present invention.

In addition to the etching section of a vertical profile illustrated in FIGS. 11a to 11f, the etching section o a bowing profile may be described by the computer simulation using the modified cell model according to the present invention, as depicted in FIG. 12.

The accuracy of the computer simulation using the modified cell model according to the present invention will now be described for the isotropic etching. In the case of the isotropic etching, the geometrical shape of a surface of a material to be etched is a circular arc. Accordingly, the coordinates (X, Y) of a certain point on the surface are represented by the following equation by using the etching speed $E_0$ and etching time t.

$$\frac{X_2 + Y_2}{E_0 t} = 1$$

When the modified cell model of the present invention is accurate, the value of the computed certain point introduced to the left side of the above equation is approximate to the right side '1'. Accordingly, the accuracy is represented as follows. The more approximate the value is to '0', the more accurate the modified cell model is.

$$Accyracy = \left|1 - \frac{X_2 - Y_2}{E_0 t}\right|$$

Figure 13A:
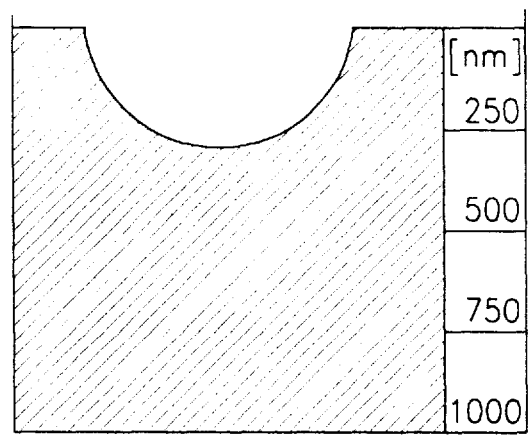
FIGS. 13a and 13b are cross-sectional viwes respectively illustrating a comparison result between the computer simulation using the modified cell model according to the present invention and the computer simulation using the conventional string model, in the case of simulating an isotropic etching.
Figure 13B:
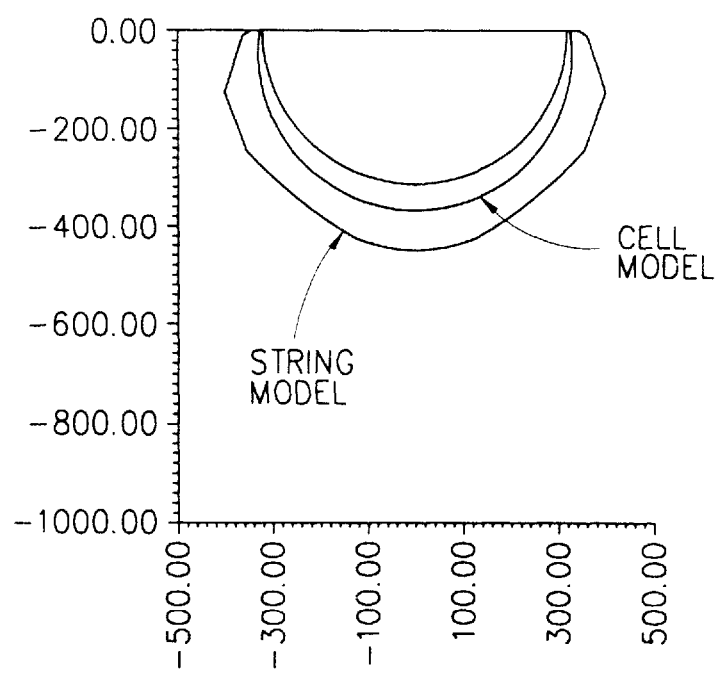

In the case of the isotropic etching, a comparison of the accuracy of the computer simulations using the modified cell model and the conventional string model is shown in FIGS. 13a and 13b, and Table 6. It is presumed that the etching speed $E_0$ is 6.0 nm/sec and the etching time t is 30 seconds.

TABLE 6

Comparison of Accuracy of Computer simulations using
Modified Cell Model and Conventional string model in Isotropic Etching.

| Modified cell model | | String model | | | |
|---|---|---|---|---|---|
| cell size: 5 × 5 | | String length: 20 | | String length: 5 | |
| $(x_i, y_i)$ | Accuracy | $(x_i, y_i)$ | Accuracy | $(x_i, y_i)$ | Accuracy |
| (0, 300) | 0.000 | (0, 450) | 1.500 | (0, 332) | 0.100 |
| (50, 295) | 0.003 | | | (51, 352) | 0.098 |
| (100, 280) | 0.009 | (101, 423) | 1.480 | (102, 314) | 0.101 |
| (150, 260) | 0.000 | (201, 375) | 1.426 | (150, 294) | 0.100 |
| (200, 220) | 0.009 | | | (201, 259) | 0.094 |
| (150, 170) | 0.008 | (301, 281) | 1.373 | (251, 212) | 0.095 |
| (295, 70) | 0.010 | | | (300, 134) | 0.097 |
| (315, 20) | 0.052 | | | (316, 97) | 0.102 |
| Average | 0.011 | Average | 1.44 | Average | 0.098 |

In Table 6, the coordinates of a certain point on the surface of the material to be isotropically etched are $(x_i, y_i)$, and the cell size of 5×5 means the width and height of the cell are '5', respectively.

As shown in FIGS. 13a, 13b and Table 6, the computer simulation using the modified cell model according to the present invention is more accurate than that using the conventional string model.

The computer simulation of the etching is explained above. It should be recognized that the computer simulation can also be carried out for the growth by the identical method.

Figure 14:
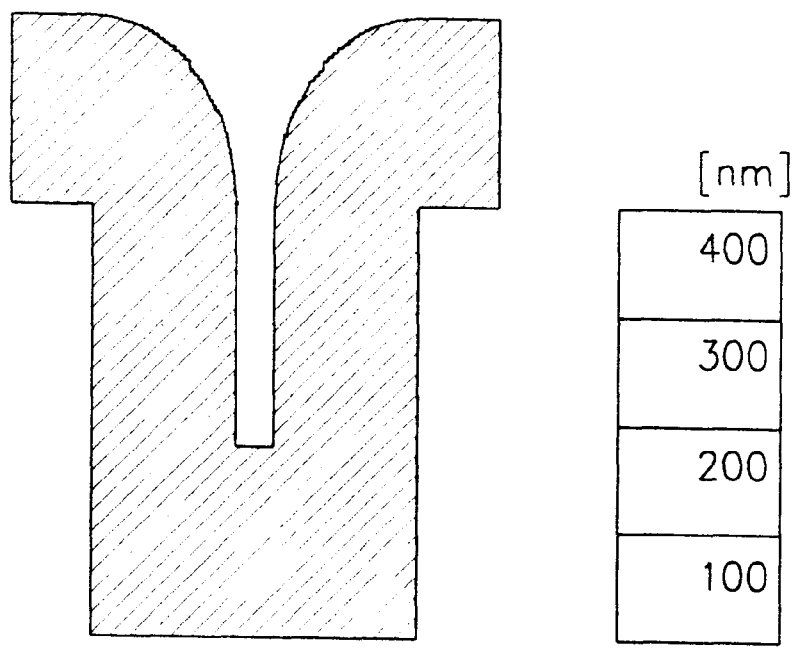
FIG. 14 is a cross-sectional view illustrating a result of the computer simulation using the modified cell model according to the present invention, in the case of simulating an isotropic growth.

In the case of an isotropic growth, the result of the computer simulation using the modified cell model according to the present invention is shown in FIG. 14 and Table 7. It is presumed that the initial section is a trench with a depth of 400 nm and a width of 400 nm, the growth speed is 6.0 nm/sec, and the growth time is 30 seconds.

TABLE 7

Accuracy of Modified cell model in Isotropic Growth.
cell size: 5 × 5

| ($x_i$, $y_i$) | Accuracy |
| --- | --- |
| (0, 300) | 0.000 |
| (50, 296) | 0.000 |
| (100, 281) | 0.006 |
| (151, 259) | 0.001 |
| (200, 221) | 0.006 |
| (250, 169) | 0.005 |
| (294, 70) | 0.007 |
| Average | 0.004 |

Referring to table 7, the average of the accuracy is 0.004, thereby confirming that the modified cell model of the present invention is successfully applied to the growth.

As described above, only the cell on the surface of the material to be etched or deposited is considered in the modified cell model. As a result, the amount of memory required is significantly reduced, and the computation time is also decreased, as compared with the conventional cell model considering the cells of the entire material.

In addition, the surface where the reaction takes place is divided into cells, and etching point is designated in each cell, and a string is made to connect the etching points. Accordingly, a loop is not generated that is may be generated in the conventional string model merely by considering the string, not the cell.

Consequently, the computation process is simpler than the conventional string model, including not requiring a loop removing step.

As the present invention may be embodied in several forms without departing from the spirit of essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A growing and etching simulation method for dividing a material to be grown or etched into cells of a fixed size, and predicting a surface shape of said material after carrying out the growing or etching for a time "T", said growing and etching simulation method using a modified cell model including growing or etching points and comprising:
   forming an initial section of the material with a single layer of open cells, wherein only the open cells are exposed to the growing or etching process;
   inputting information, including growing or etching points, into each open cell;
   computing a movement speed for the growing or etching points;
   moving the growing or etching points for a time increment, wherein moving the growing or etching points is determined according to the movement speed; and
   forming a new growing or etching section by rearranging the open cells exposed to the growing or etching, after moving the growing or etching points; and
   repeating the above steps on the re-arranged open cells until the sum of a time increment reaches the time (T).

2. The growing and etching simulation method of claim 1, wherein each open cell comprises a square.

3. The growing and etching simulation method of claim 1, wherein the information inputted for each open cell comprises, the growing or etching point, serial number, coordinates, shape number and surface angles.

4. The growing and etching simulation method of claim 3, wherein the growing or etching point comprises a point where the growing or etching is carried out in a single open cell, and comprises two real numbers forming rectangular coordinates with an origin at a bottom left side of the corresponding open cell.

5. The growing and etching simulation method of claim 3, wherein the serial number indicates a linking order of each of the open cells, and comprises natural numbers designating each open cell in a sequential order.

6. The growing and etching simulation method of claim 3, wherein the coordinates indicate the position of each open cell, and comprise numbers of a rectangular coordinate system wherein a vertical axis of the rectangular coordinate system is parallel to a vertical wall of the open cell and a horizontal axis of the rectangular coordinate system is parallel to a horizontal wall of the open cell.

7. The growing and etching simulation method of claim 3, wherein the shape number indicates the position relationship between each open cell and adjacent open cells, and comprises at least two position numbers, wherein the position at the left side of the open cell is '1', the bottom left side of the open cell corresponds to position number '2', the position at the bottom side of the open cell corresponds to position number '3', the position at the bottom right side of the open cell corresponds to position number '4', the position at the right side of the open cell corresponds to position number '5', the position at the top right side of the open cell corresponds to position number '6', the position at the top side of the open cell corresponds to position number '7', and the position at the top left side of the open cell corresponds to position number '8'.

8. The growing and etching simulation method of claim 3, wherein the surface angles are each an acute angle of less than the absolute value of 90° between two sections formed based on the growing or etching point and the horizontal side of the respective open cell.

9. The growing and etching simulation method of claim 1, wherein the movement speed is based on values of an angle between the open cell and a growing or etching medium and a reaction speed based on a reaction constant of a growing or etching reaction and an experimentally obtained growing or etching variable.

10. The growing and etching simulation method of claim 9, wherein, the experimentally obtained growing or etching variable is determined by a growing or etching apparatus, and wherein the experimentally obtained growing or etching variable comprises a pressure in a chamber where the growing or etching takes place.

11. The growing and etching simulation method of claim 1, wherein the time increment to move the growing or etching point is a shortest value selected from the values of the time for each growing or etching point to move to a side of its respective open cell computed based on the movement speed of the respective growing or etching point.

12. The growing and etching simulation method of claim 1, wherein rearranging the open cells comprises an extinction or an addition of at least one open cell.

13. The growing and etching simulation method of claim 12, wherein the extinction of an open cell comprises removing the respective open cell when the growing or etching point reaches a side of the open cell.

14. The growing and etching simulation method of claim 12, wherein a number of open cells to be added and a configuration of the open cells to be added are determined according to the position of the side of the open cell where the growing or etching point reaches.

15. The growing and etching simulation method of claim 1, wherein the inputted information comprises attributes characterizing each open cell, as well as the open cell's corresponding growing or etching point.

16. The growing and etching simulation method of claim 15, wherein the attributes characterizing an open a cell comprise the corresponding open cell's serial number, coordinates and shape numbers, and the attributes characterizing a growing or etching point comprise the corresponding growing or etching point's surface angles, and beginning coordinates.

17. The growing and etching simulation method of claim 2, wherein the size of the square is selected in accordance with a selected surface shape resolution and computation time.

18. The growing and etching simulation method of claim 4, wherein the two real numbers have a value greater than zero and less than a length of a side of the respective open cell.

19. The growing and etching simulation method of claim 3, wherein each shape number comprises at least one position number and each position number ranges between 1 and 8, inclusively.

20. The growing and etching of claim 3, wherein the surface angles are angles formed between a line parallel to a horizontal axis "I" and a line defined by the endpoints of the growing or etching point in the open cell and the growing or etching point in the adjacent open cells, respectively.

21. A method to simulate growing and etching a surface of a material, comprising:
dividing a portion of the material into a single layer of open cells wherein each open cell is in contact with a growing or etching medium and has an etching point therein;
assigning cell attributes to each open cell and growing or etching point attributes to each growing or etching point;
computing a movement velocity for the growing or etching points;
determining a time increment, wherein the time increment is proportional to the movement velocity and a distance a growing or etching point must move to contact a wall of its respective open cell;
moving each growing or etching point for a time period equal to the time increment;
extinguishing each open cell for which the open cell's growing or etching point has reached a wall of its respective open cell;
defining a new open cell for each cell exposed to the growing or etching medium for the first time after extinguishing each open cell; and
rearranging the open cells.

22. The method of claim 21, wherein the surface of a material is approximated by a series of line segments wherein each line segment is defined by a corresponding pair of growing or etching points.

23. The method of claim 21, wherein dividing the material into open cells comprises dividing the material into square cells.

24. The method of claim 22, wherein assigning cell attributes to each open cell comprises assigning a cell a corresponding serial number, coordinates and shape numbers.

25. The method of claim 22, wherein assigning growing or etching point attributes to each growing or etching point comprises assigning each growing or etching point growing or etching point surface angles, and beginning coordinates.

26. The method of claim 22, wherein the distance a growing or etching point must move to reach a wall of its respective open cell to which the time increment is proportional comprises the shortest distance any of the growing or etching points will move to reach a wall of its respective open cell.

27. A computer-readable medium encoded with executable instructions that can cause a client computer to perform functions of simulating growing and etching of a surface of a material, the functions comprising:
dividing a portion of the material into a single layer of open cells wherein each open cell is in contact with a growing or etching medium and has a growing or etching point therein;
assigning cell attributes to each open cell and growing or etching point attributes to each growing or etching point;
computing a movement velocity for the growing or etching points;
determining a time increment, wherein the time increment is proportional to the movement velocity and a distance a growing or etching point must move to contact a wall of its respective open cell;
moving each growing or etching point for a time period equal to the time increment;
extinguishing each open cell for which the open cell's growing or etching point has reached a wall of its respective open cell;
defining a new open cell for each open cell exposed to the growing or etching medium for the first time after extinguishing each open cell; and
rearranging the open cells.

28. The computer-readable medium of claim 27, further encoded with executable instructions that can cause a client computer to perform the function of approximating the surface of a material with a series of line segments wherein each line segment is defined by a corresponding pair of growing or etching points.

* * * * *